United States Patent
Lee et al.

(10) Patent No.: US 9,076,887 B2
(45) Date of Patent: Jul. 7, 2015

(54) METHOD OF FABRICATING A VERTICAL DIFFUSION METAL-OXIDE-SEMICONDUCTOR TRANSISTOR

(75) Inventors: Tsung-Hsiung Lee, Taoyuan County (TW); Shang-Hui Tu, Nantou County (TW); Rudy Octavius Sihombing, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 13/464,584

(22) Filed: May 4, 2012

(65) Prior Publication Data
US 2013/0149822 A1    Jun. 13, 2013

(30) Foreign Application Priority Data
Dec. 8, 2011    (TW) .............................. 100145294 A

(51) Int. Cl.
| | | |
|---|---|---|
| H01L 29/78 | (2006.01) | |
| H01L 29/66 | (2006.01) | |
| H01L 21/336 | (2006.01) | |
| H01L 21/8234 | (2006.01) | |
| H01L 29/06 | (2006.01) | |

(Continued)

(52) U.S. Cl.
CPC .. *H01L 21/823487* (2013.01); *H01L 29/66719* (2013.01); *H01L 29/0653* (2013.01); *H01L 29/0634* (2013.01); *H01L 29/7802* (2013.01); *H01L 29/0649* (2013.01); *H01L 29/66712* (2013.01); *H01L 21/26586* (2013.01); *H01L 27/088* (2013.01)

(58) Field of Classification Search
CPC .................................................. H01L 29/43268
USPC .................................................. 257/E29.262
See application file for complete search history.

(56) References Cited

U.S. PATENT DOCUMENTS

| | | | |
|---|---|---|---|
| 6,645,815 B2 * | 11/2003 | Hshieh et al. | 438/270 |
| 7,364,994 B2 | 4/2008 | Hshieh et al. | |
| 8,642,427 B1 * | 2/2014 | Sihombing et al. | 438/268 |

(Continued)

FOREIGN PATENT DOCUMENTS

| | | |
|---|---|---|
| CN | 101165863 A | 4/2008 |
| CN | 101997034 A | 3/2011 |

(Continued)

*Primary Examiner* — Colleen A Matthews
*Assistant Examiner* — Regan J Rundio
(74) *Attorney, Agent, or Firm* — Birch, Stewart, Kolasch & Birch, LLP

(57) ABSTRACT

A method for fabricating a semiconductor device is provided. A method for fabricating a semiconductor device includes providing a semiconductor substrate having a first conductive type. An epitaxy layer having the first conductive type is formed on the semiconductor substrate. First trenches are formed in the epitaxy layer. First insulating liner layers are formed on sidewalls and bottoms of the first trenches. A first dopant having the first conductive type dopes the epitaxy layer from the sidewalls of the first trenches to form first doped regions. A first insulating material is filled into the first trenches. Second trenches are formed in the epitaxy layer. Second insulating liner layers are formed on sidewalls and bottoms of the second trenches. A second dopant having a second conductive type dopes the epitaxy layer from the sidewalls of the second trenches to form second doped regions.

14 Claims, 7 Drawing Sheets

(51) Int. Cl.
*H01L 21/265* (2006.01)
*H01L 27/088* (2006.01)

(56) References Cited

U.S. PATENT DOCUMENTS

| | | | |
|---|---|---|---|
| 2003/0132450 A1* | 7/2003 | Minato et al. | 257/110 |
| 2004/0119116 A1* | 6/2004 | Byeon et al. | 257/335 |
| 2004/0238844 A1* | 12/2004 | Tokano et al. | 257/197 |
| 2004/0245570 A1* | 12/2004 | Ninomiya | 257/330 |
| 2006/0097313 A1* | 5/2006 | Yanagisawa et al. | 257/329 |
| 2006/0138536 A1* | 6/2006 | Kouzuki et al. | 257/341 |
| 2007/0034947 A1* | 2/2007 | Loechelt et al. | 257/341 |
| 2009/0026586 A1* | 1/2009 | Anderson | 257/623 |
| 2010/0258854 A1* | 10/2010 | Tokano et al. | 257/328 |
| 2011/0049615 A1* | 3/2011 | Saito et al. | 257/329 |

FOREIGN PATENT DOCUMENTS

| | | |
|---|---|---|
| JP | 2007-087985 A | 4/2007 |
| TW | 513767 | 12/2002 |
| WO | WO 02/067333 A1 | 8/2002 |

\* cited by examiner

US 9,076,887 B2

METHOD OF FABRICATING A VERTICAL DIFFUSION METAL-OXIDE-SEMICONDUCTOR TRANSISTOR

CROSS REFERENCE TO RELATED APPLICATIONS

This Application claims priority of Taiwan Patent Application No. 100145294, filed on Dec. 8, 2011, the entirety of which is incorporated by reference herein.

BACKGROUND OF THE INVENTION

1. Field of the Invention

The present invention relates to a method for fabricating a semiconductor device, and in particular, to a method for fabricating a semiconductor device having a super junction structure.

2. Description of the Related Art

The conventional vertical diffusion metal-oxide-semiconductor field effect transistor (VDMOSFET) has a p-n junction structure composed of an n-type drift doped region and an overlying p-type base doped region. The p-n junction structure is mainly used to withstand a voltage applied to the conventional VDMOSFET. When improving an operation voltage of the VDMOSFET, a reduced dopant concentration and an increased thickness of the n-type drift doped region is required. The ways to improve a withstand voltage of the p-n junction structure results in an increased on-resistance (Ron) for the conventional VDMOSFET. Ron of the conventional VDMOSFET is limited by the dopant concentration and the thickness of the n-type drift doped region. A VDMOSFET having a super junction structure has been developed to improve the dopant concentration of the n-type drift doped region, so that Ron of the VDMOSFET can be improved.

The conventional super junction structure is usually fabricated by a multi-epitaxy technology (COOLMOS™). The multi-epitaxy technology requires performing several process cycles of an epitaxy growing process, a p-type dopant implantation process and a thermal diffusion process. Therefore, the multi-epitaxy technology has drawbacks of having plenty of processing steps, and a high fabrication cost. Also, the dimensions of the VDMOSFET are hard to reduce.

Thus, a method for fabricating a semiconductor device having a super junction structure is desired.

BRIEF SUMMARY OF INVENTION

A method for fabricating a semiconductor device is provided. An exemplary embodiment of a method for fabricating a semiconductor device comprises providing a semiconductor substrate having a first conductive type. An epitaxy layer having the first conductive type is formed on the semiconductor substrate. A plurality of first trenches is formed in the epitaxy layer. A plurality of first insulating liner layers is formed on sidewalls and bottoms of the first trenches. A first doping process is performed to dope the epitaxy layer from the sidewalls of the first trenches with a first dopant having the first conductive type to form a plurality of first doped regions. A first insulating material is filled into the first trenches. A plurality of second trenches is formed in the epitaxy layer. A plurality of second insulating liner layers is formed on sidewalls and bottoms of the second trenches. A second doping process is performed to dope the epitaxy layer from the sidewalls of the second trenches with a second dopant having a second conductive type to form a plurality of second doped regions. A second insulating material is filled into the second trenches.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
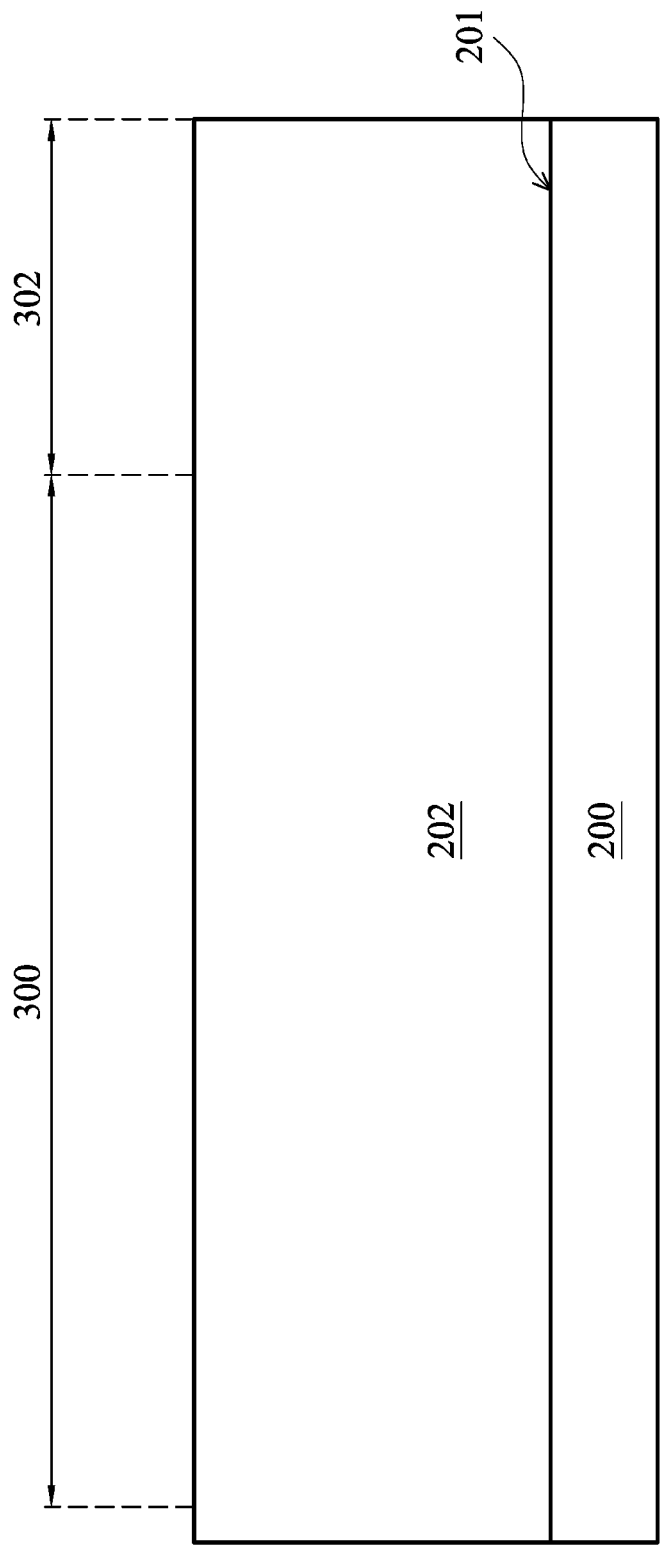
FIGS. 1 to 7 are cross section views showing one exemplary embodiment of a method for fabricating a semiconductor device of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIGS. 1 to 7 are cross section views showing one exemplary embodiment of a method for fabricating a semiconductor device 500 of the invention. One exemplary embodiment of a semiconductor device 500 comprises a metal-oxide-semiconductor field effect transistor (MOSFET) having super junction structures, for example, a super junction vertical diffusion MOSFET (super junction VDMOSFET). As shown in FIG. 1, a semiconductor substrate 200 having a first conductive type is provided. Next, an epitaxy layer 202 having the first conductive type is formed on the semiconductor substrate 200 by an epitaxy growing process. In one embodiment, the semiconductor substrate 200 has the same conductive type as the epitaxy layer 202, and a dopant concentration of the semiconductor substrate 200 is larger than that of the epitaxy layer 202. In one embodiment, the semiconductor substrate 200 may be a heavily doped n-type (N+) semiconductor substrate 200, while the epitaxy layer 202 may be a lightly doped n-type (N−) epitaxy layer 202. As shown in FIG. 1, the epitaxy layer 202 may comprise an active region 300 and a termination region 302 surrounding the active region 300. In one embodiment, the active region 300 may be provided with semiconductor devices formed thereon, and the termination region 302 is used as an isolation feature between the semiconductor devices.

Figure 2:
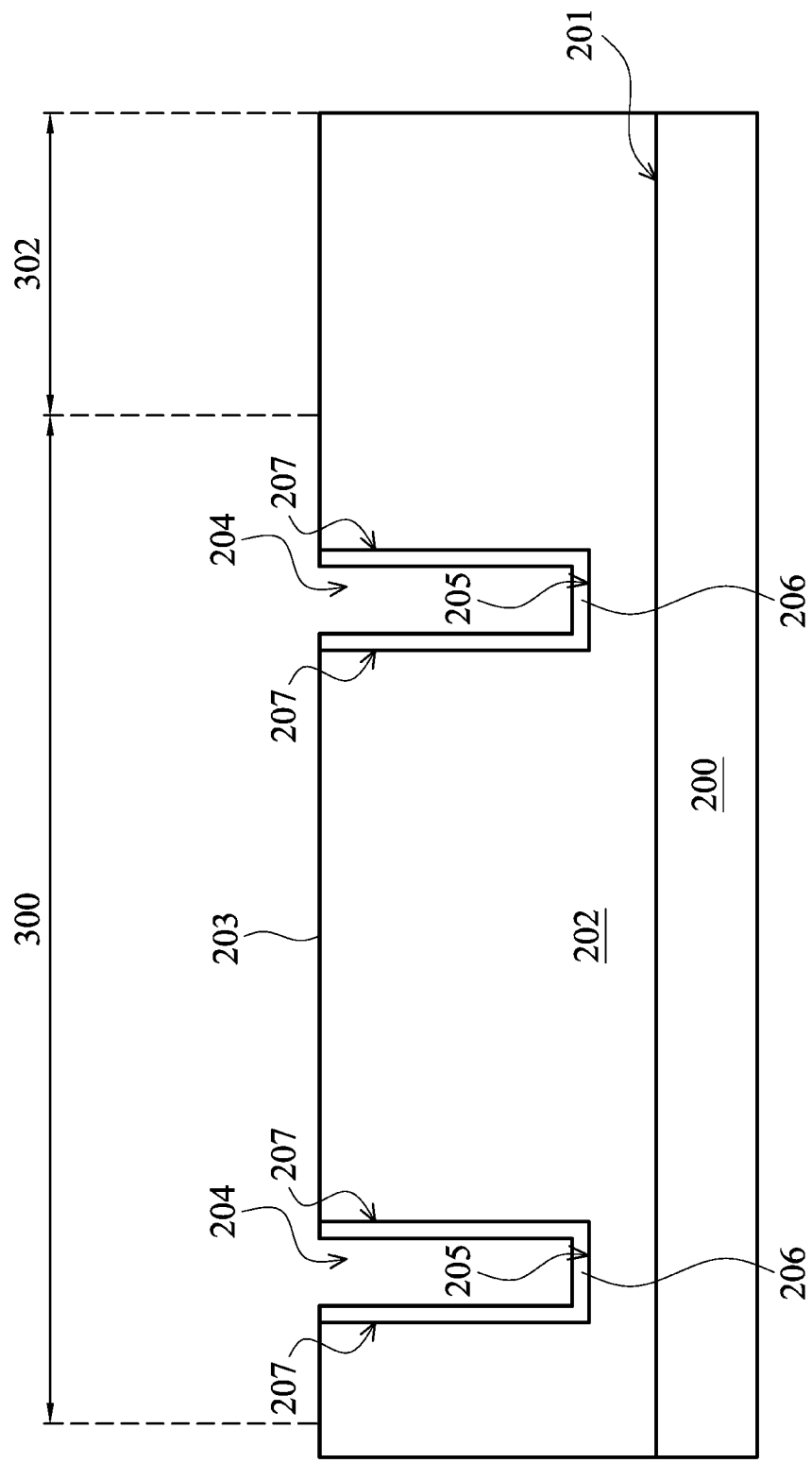

Next, please refer to FIG. 2, wherein the formation of first trenches 204 is described. A hard mask (not shown) is formed on the epitaxy layer 202 by performing a low pressure chemical vapor deposition (LPCVD) process. Next, a photolithography process and a patterning process are performed to form a mask pattern (not shown) covering the active region 300 of the epitaxy layer 202, so that formation positions of a first trench are defined. Next, the epitaxy layer 202 not covered by the mask pattern is removed to form a plurality of first trenches 204 in the active region 300 of the epitaxy layer 202.

In one embodiment, bottom surfaces 205 of the first trenches 204 may contact an interface 201 between the semiconductor substrate 200 and the epitaxy layer 202. Alternatively, the bottom surfaces 205 of the first trenches 204 may be within the epitaxy layer 202 (i.e. close to the interface 201).

Next, a first insulating liner layer 206 is conformally formed on sidewalls 207 and the bottom surfaces 205 of the first trenches 204 by performing a process such as a thermal oxide growing method after removing the mask pattern. In one embodiment, the first insulating liner layer 206 may be an oxide liner layer, which can be used to release a stress from the epitaxy layer 202. Also, the first insulating liner layer 206 may serve as a pre-implant oxide layer, which is used in a subsequent doping process to reduce a channel effect.

Figure 3:
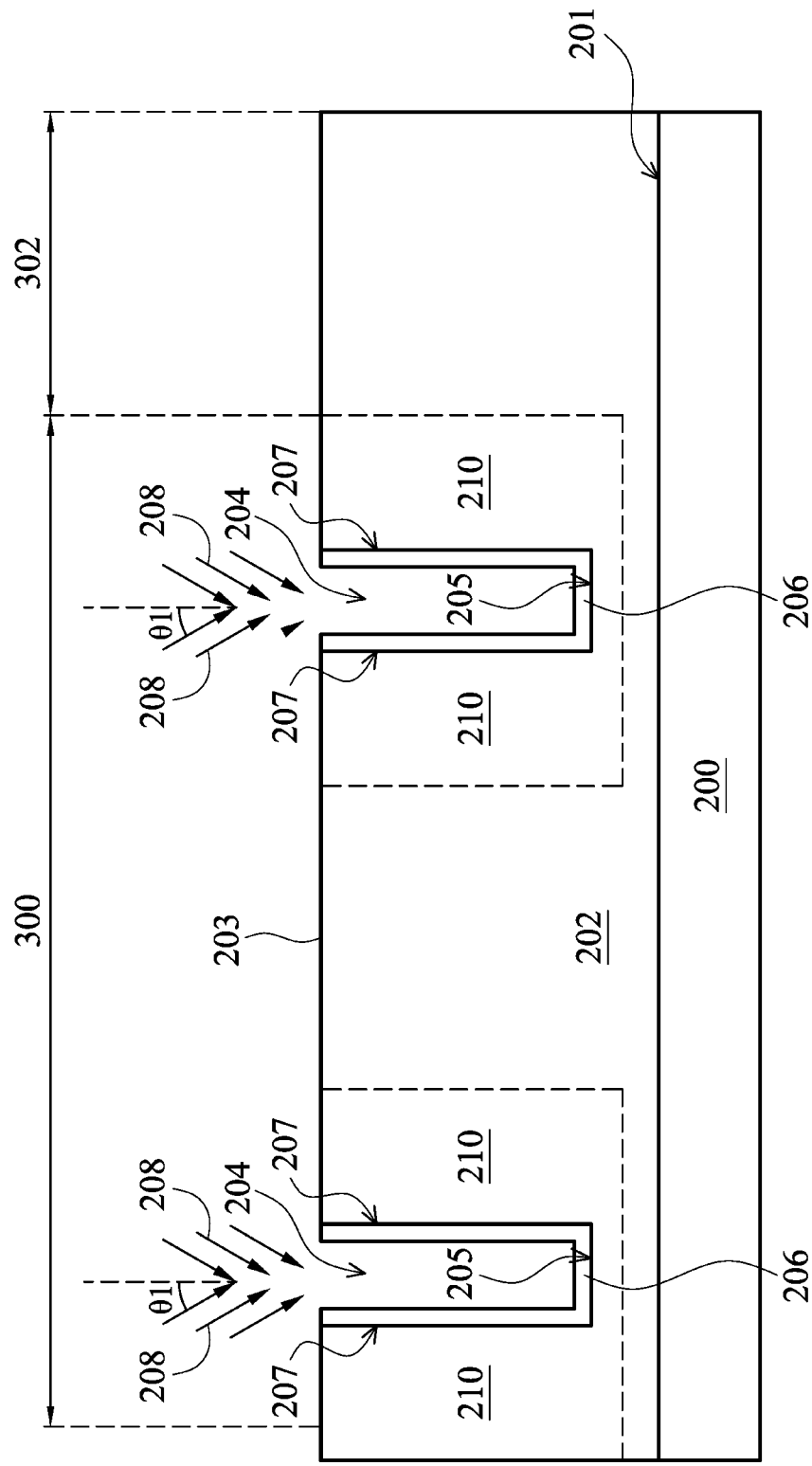

Next, please refer to FIG. 3, wherein a doping process 208 is performed to dope a first dopant having the first conductive type into a portion of the epitaxy layer 202 from the two opposite sidewalls 207 of each of the first trenches 204 to form a plurality of first doped regions 210. In one embodiment, a doping angle θ1 of the doping process 208 is mainly determined by a width and a depth of the first trenches 204. For example, the doping angle θ1 of the doping process 208 may be between 1 and 10 degree. Additionally, in one embodiment, the first dopant may comprise n-type dopants including phosphorus (P) or arsenic (As). In one embodiment, a diffusion process may be performed after performing the doping process 208. A process temperature of the diffusion process may be between about 800° C. and 1500° C., so that the first dopant can be uniformly distributed in the first doped regions 210. The first doped regions 210 are n-type doped regions after the diffusion process is performed. Also, a dopant concentration of the first doped regions 210 is larger than that of the epitaxy layer 202 and smaller than that of the semiconductor substrate 200. As shown in FIG. 3, the first doped regions 210 substantially surround the first trenches 204. A depth of the first doped regions 210 (i.e. a distance between a top surface 203 of the epitaxy layer 202 and a bottom surface of the first doped region 210) is substantially larger than that of the first trenches 204 (i.e. a distance between the top surface 203 of the epitaxy layer 202 and the bottom surface 205 of the first trench 204). Therefore, the bottom surfaces 205 of the first trenches 204 are positioned within the first doped regions 210.

Figure 4:
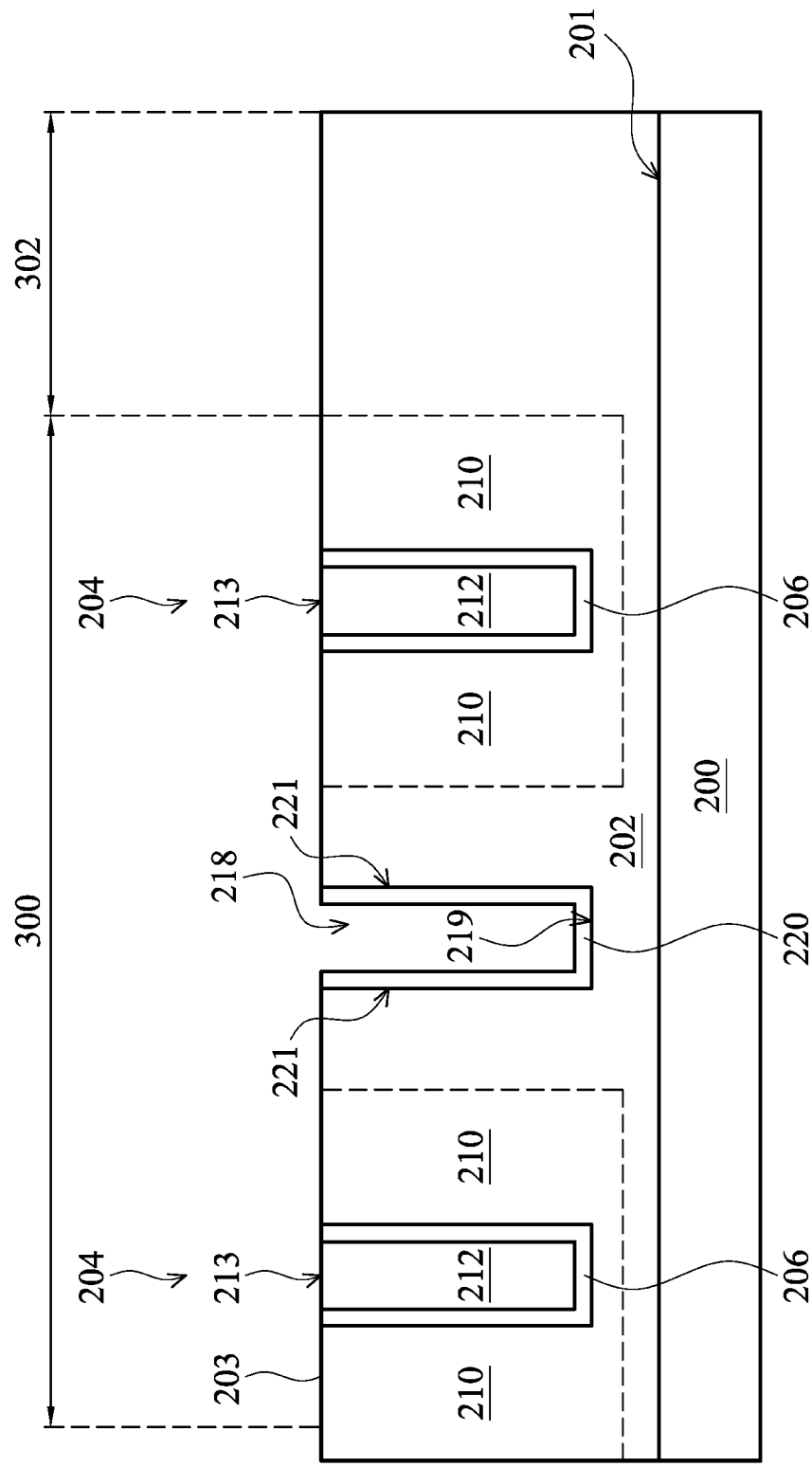

Next, please refer to FIG. 4, wherein a deposition process such as a LPCVD method or a coating process such as a spin-on glass (SOG) method may be performed to fill a first insulating material 212 in the first trenches 204, covering the first insulating liner layer 206. Next, a planarization process such as a chemical mechanical polishing (CMP) method is performed to remove the unnecessary first insulating material 212 above the top surface 203 of the epitaxy layer 202. In one embodiment, the first insulating material 212 may comprise oxide materials or non-doped poly silicon materials. Also, a top surface 213 of the first insulating material 212 is aligned to the top surface 203 of the epitaxy layer 202 after the planarization process is performed.

Please refer to FIG. 4 again, wherein the formation of a second trench 218 is described. In this embodiment, only one of the second trench 218 is illustrated in the figures for brevity. Alternatively, a number of the second trench 218 may be two or more than two, according to the design of a device. A hard mask (not shown) is formed on the epitaxy layer 202 by performing a low pressure chemical vapor deposition (LPCVD) process. Next, a photolithography process and a patterning process are performed to form a mask pattern (not shown) covering the active region 300 of the epitaxy layer 202, so that a formation position of a second trench is defined.

In one embodiment, the first trenches 204 and the subsequence of the second trench 218 are alternatively disposed in the active region 300 of the epitaxy layer 202. That is to say, two opposite sides of the second trench are respectively adjacent to one of the first trenches 204. Next, the epitaxy layer 202 not covered by the mask pattern is removed to form the second trench 218 in the active region 300 of the epitaxy layer 202. In one embodiment, a bottom surface 219 of the second trench 218 may contact an interface 201 between the semiconductor substrate 200 and the epitaxy layer 202. Alternatively, the bottom surface 219 of the second trench 218 may be within the epitaxy layer 202 (i.e. close to the interface 201). In one embodiment, the first trenches 204 may have a width and depth, which is the same as that of the second trench 218. Alternatively, the width and depth of the second trench 218 can be respectively adjusted according characteristics required by a device.

Next, a second insulating liner layer 220 is conformally formed on sidewalls 221 and the bottom surface 219 of the second trench 218 by performing a process such as a thermal oxide growing method after removing the mask pattern. In one embodiment, the second insulating liner layer 220 may be an oxide liner layer to release a stress from the epitaxy layer 202. Also, the second insulating liner layer 220 may serve as a pre-implant oxide layer, which is used in a subsequent doping process to reduce a channel effect.

Figure 5:
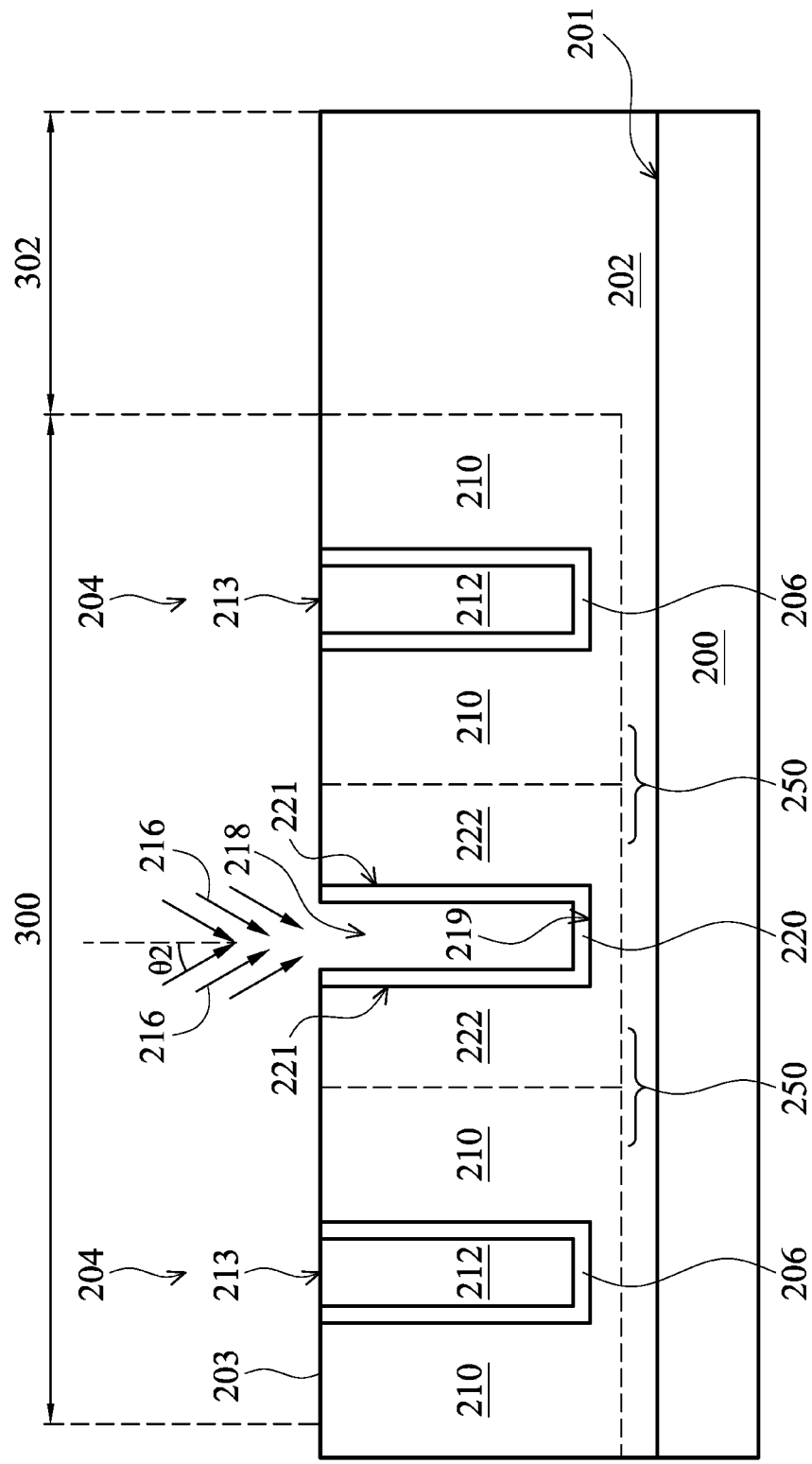

Next, please refer to FIG. 5, wherein a doping process 216 is performed to dope a second dopant having a second conductive type, which is opposite to the first conductive type, into a portion of the epitaxy layer 202 from the two opposite sidewalls 221 of the second trench 218 to form a second doped region 222. In this embodiment, only one second doped region 222 is illustrated in the figures for brevity. Alternatively, a number of the second doped region 222 may be two or more than two, according to the design of a device. In one embodiment, a doping angle θ2 of the doping process 216 is mainly determined by a width and a depth of the second trench 218. For example, the doping angle θ2 of the doping process 216 may be between 1 and 10 degrees. Additionally, in one embodiment, the second dopant may comprise p-type dopants comprising boron (B). In one embodiment, a diffusion process may be performed after performing the doping process 216. A process temperature of the diffusion process may be between about 800° C. and 1500° C., so that the second dopant can be uniformly distributed in the second doped region 222. The second doped region 222 is p-type doped region after the diffusion process is performed. Also, a dopant concentration of the second doped region 222 is larger than that of the epitaxy layer 202 and smaller than that of the semiconductor substrate 200. As shown in FIG. 5, the second doped region 222 substantially surrounds the second trench 218. A depth of the second doped region 222 (i.e. a distance between a top surface 203 of the epitaxy layer 202 and a bottom surface of the second doped region 222) is substantially larger than that of the second trench 218 (i.e. a distance between the top surface 203 of the epitaxy layer 202 and the bottom surface 219 of the second trench 218). Therefore, the bottom surface 219 of the second trench 218 is positioned within the second doped region 222.

Figure 6:
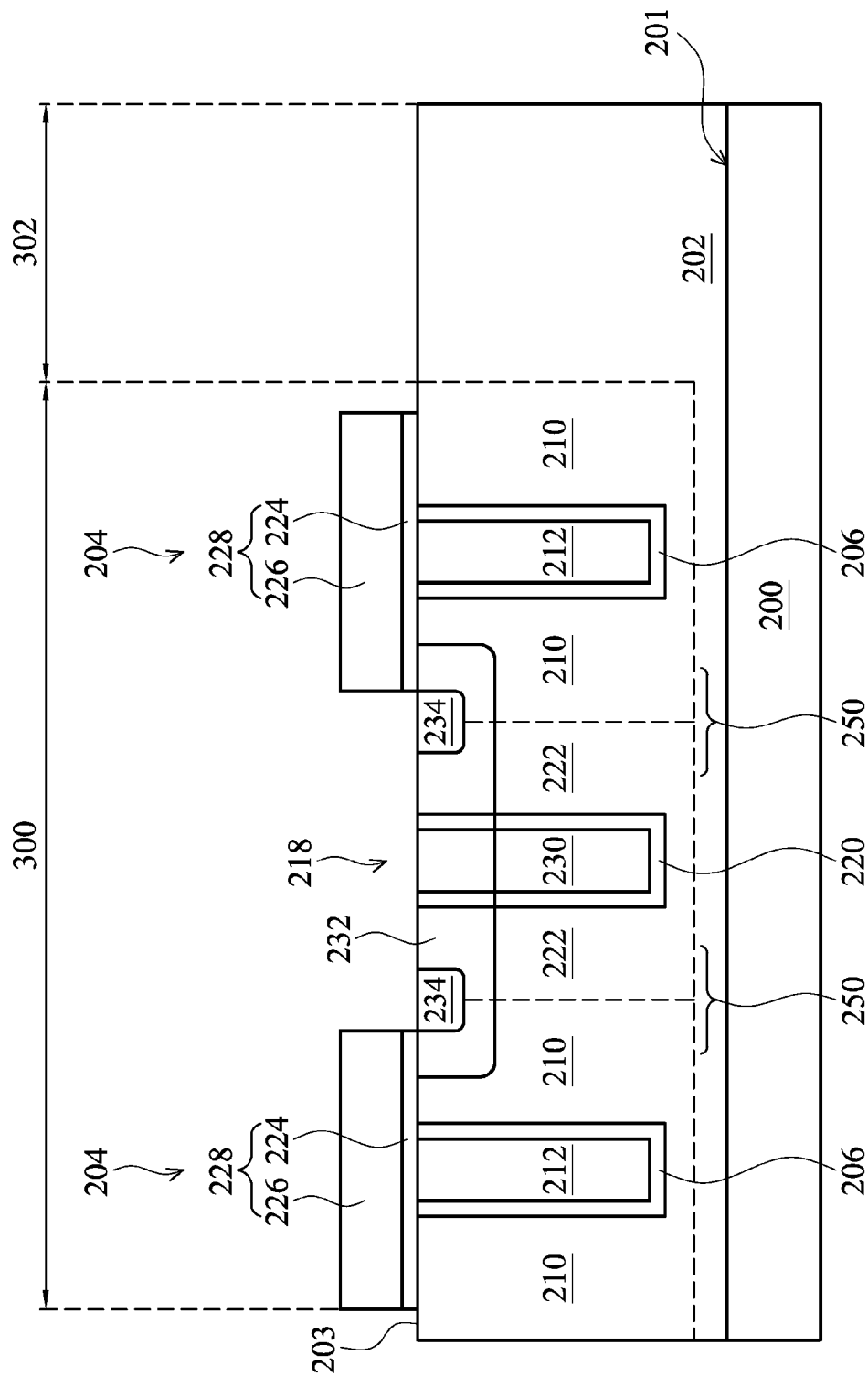

Next, please refer to FIG. 6, wherein a deposition process such as a LPCVD method or a coating process such as a spin-on glass (SOG) method may be performed to fill a second insulating material 230 in the second trench 218, covering the second insulating liner layer 220. Next, a planarization process such as a chemical mechanical polishing (CMP) method is performed to remove the unnecessary second insulating material 230 above the top surface 203 of the epitaxy layer 202. In one embodiment, the second insulating material 230 may comprise oxide materials or non-doped poly silicon materials. Also, a top surface of the second insulating material 230 is aligned to the top surface 203 of the epitaxy layer 202 after the planarization process is performed. After performing the aforementioned processes, one exemplary embodiment of a super junction structure 250 is formed having the first doped regions 210 and the second doped regions 222, wherein each of the first doped regions 210 is adjacent to one of the second doped regions 222. Also, the first doped regions 210 have a conductive type opposite to the second doped regions 222. Alternatively, the conductive types of the first doped regions 210 and the second doped regions 222 of the super junction structure 250 can be switched.

A semiconductor device such as a VDMOSFET fabricated on the super junction structure 250 is described with reference to FIGS. 6-7. Next, please refer to FIG. 6, wherein a gate oxide layer (not shown) and a gate layer (not shown) are entirely formed on the epitaxy layer 202 in sequence. In one embodiment, a thin film deposition method such as a thermal oxide growing method, a chemical vapor deposition (CVD) method or an atomic layer deposition (ALD) method may be used to form the gate oxide layer. In one embodiment, a thin film deposition method such as a physical vapor deposition (PVD) method, an ALD method, a sputtering method or a plating method may be used to form the gate layer. In one embodiment, the gate oxide layer may comprise oxide, nitride, oxynitride, oxycarbide or combinations thereof. In one embodiment, the gate layer may be a polysilicon layer. Next, a patterned photoresist layer (not shown) may cover the active region 300 of the epitaxy layer 202 to define formation positions of gate oxide layer patterns 224 and gate layer patterns 226 formed in the subsequent process. Next, an anisotropic etching process is performed to remove a portion of the gate layer and the gate oxide layer, thereby forming a plurality of gate structures 228 composed by the gate oxide layer patterns 224 and the gate layer patterns 226. In one embodiment, the gate structures 228 respectively cover the first trenches 204 and a portion of the epitaxy layer 202, which is adjacent to the trenches 204. Also, the second trench 218 is exposed through the gate structures 228. Next, the patterned photoresist layer is removed. As shown in FIG. 6, sidewalls of the gate structures 228 are positioned within boundaries of the first doped regions 210. That is to say, portions of the first doped regions 210 are exposed from the gate structures 228.

Next, please refer to FIG. 6, wherein a doping process is performed using the gate structures 228 as masks to form a first well 232 in the active region 300 of the epitaxy layer 202. As shown in FIG. 6, the first well 232 is positioned between the two adjacent gate structures 228. Also, the first well 232 partially overlaps with the second trench 218. Further, the first well 232 is positioned above the second doped regions 222. In one embodiment, the first well 232 may serve as a p-type well 232, and a boundary of the first well 232 adjacent to the surface of the epitaxy layer 202 is positioned within the first doped regions 210. The conductive type of the first doped regions 210 within the first well 232 is converted into p type. Next, a doping process is performed using with a patterned photoresist layer (not shown) as a mask to form a plurality of source regions 234 in the first well 232. In one embodiment, the conductive type of the source regions 234 within the first well 232 is converted into n type. Also, a dopant concentration of the source regions 234 is larger than that of the first well 232. As shown in FIG. 6, the two source regions 234 are respectively adjacent to one side of each of the two different gate structures 228. Also, the two adjacent gate structures 228 commonly use the same first well 232. Therefore, the two source regions 234 of the two adjacent gate structures 228 are both formed in the same one first well 232. Interfaces between the first doped regions 210 and the second doped regions 222 of the super junction structure 250 may necessarily be positioned under the source regions 234. Also, positions of the interfaces between the first doped regions 210 and the second doped regions 222 can be adjusted according the characteristics required by a device. Additionally, the n-type semiconductor substrate 200 may serve as a drain of the formed VDMOSFET.

Figure 7:
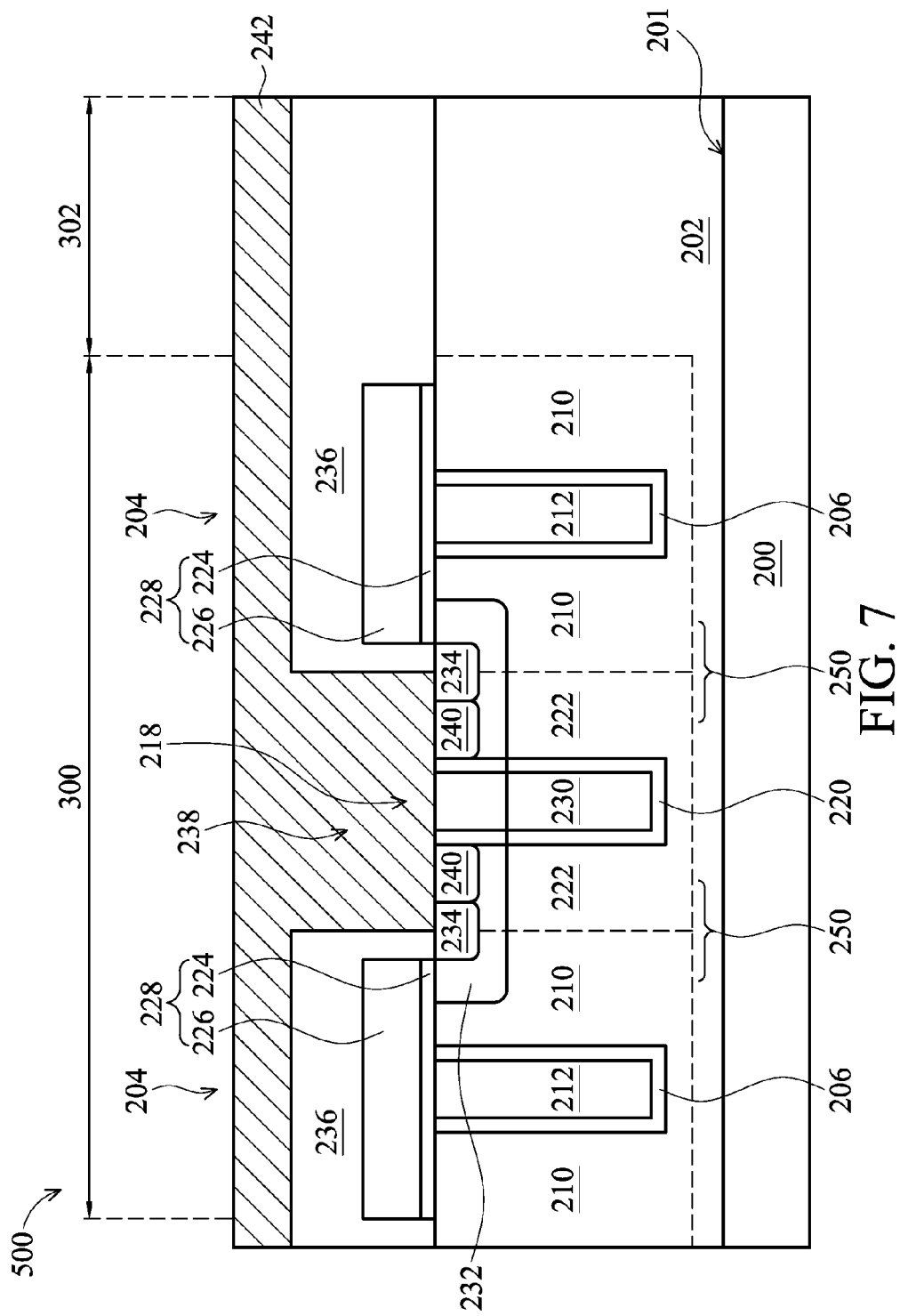

Next, please refer to FIG. 7, wherein a deposition process such as a CVD method is performed to entirely form an interlayer dielectric (ILD) layer 236 covering the epitaxy layer 202 and the gate structures 228. Next, a patterned photoresist layer (not shown) may cover the ILD layer 236 to define the position of a subsequently formed contact hole 238. Next, an anisotropic etching process is performed to remove a portion of the ILD layer 236, thereby forming a contact hole 238. It is noted that a number of the contact hole 238 may be two or more than two, according to the design of a device. As shown in FIG. 7, portions of the source regions 234 and a portion of the first well 232 adjacent to the source regions 234 are exposed from the contact hole 238.

Next, please refer to FIG. 7 again, wherein a doping process is performed to dope a dopant into a portion of the epitaxy layer 202 exposed from the contact hole 238 to form a plurality of pick-up doped regions 240 having the second conductive type. In one embodiment, the pick-up doped regions 240 are p-typed. As shown in FIG. 7, the pick-up doped regions 240 are respectively adjacent to different sidewalls 221 of the same second trench 218. Also, each of the pick-up doped regions 240 is adjacent to one of the source regions 234, above the second doped regions 222.

Next, please refer to FIG. 7 again, wherein a deposition process such as a sputtering method is used to entirely form a conductive material which fills into the contact hole 238 to form a contact plug 242. After performing the aforementioned processes, one exemplary embodiment of a semiconductor device 500 having a super junction structure 250, for example, a VDMOSFET, is formed.

The method for fabricating a semiconductor device 500 uses an n-type VDMOSFET as one exemplary embodiment. Alternatively, the aforementioned first and second conductive types can be exchanged to fabricate a p-type VDMOSFET.

One exemplary embodiment provides a semiconductor device 500 having a super junction structure 250. One exemplary embodiment of a super junction structure 250 is formed by etching an n-type epitaxy layer having a low dopant concentration to form a trench. Next, the n-type epitaxy layer is implanted with a dopant having a higher dopant concentration than the n-type epitaxy layer at a small doping angle from sidewalls of the trench, thereby forming n-type doped regions in the n-type epitaxy layer. After an insulating material is filled into the trench, the n-type epitaxy layer is etched to form another trench. Next, the n-type epitaxy layer is implanted with a dopant having a higher dopant concentration than the n-type epitaxy layer at a small doping angle from sidewalls of the trench, thereby forming p-type doped regions in the n-type epitaxy layer. Therefore, a pillar shaped P-N super junction structure is formed. Compared with the conventional technology, the super junction structure 250 can achieve a goal of charge balance by controlling the dopant concentrations of the n-type doped regions and the p-type doped regions. Therefore, the dopant concentrations of the n-type epitaxy layer can be reduced from about 2E14 to about 1E14~4E13. The dopant concentrations of the n-type epitaxy layer can be adjusted according to the design of a device. Additionally, the super junction structure 250 can be fabricated without additional epitaxy growing processes. Therefore, the fabrication cost is reduced. Compared with the conventional technology, semiconductor devices fabricated on the super junction structure 250 may have a smaller size.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
    providing a semiconductor substrate having a first conductive type;
    forming an epitaxy layer having the first conductive type on the semiconductor substrate;
    forming a plurality of first trenches in the epitaxy layer;
    conformably forming a plurality of first insulating liner layers on sidewalls and bottoms of the first trenches;
    performing a first doping process to dope the epitaxy layer only from the sidewalls of the first trenches with a first dopant having the first conductive type to form a plurality of first doped regions;
    filling a first insulating material into the first trenches;
    forming a plurality of second trenches in the epitaxy layer;
    conformably forming a plurality of second insulating liner layers on sidewalls and bottoms of the second trenches;
    performing a second doping process to dope the epitaxy layer only from the sidewalls of the second trenches different from the first trenches with a second dopant having a second conductive type to form a plurality of second doped regions;
    filling a second insulating material into the second trenches; and
    forming a plurality of gate structures, wherein the gate structures respectively cover the first trenches and portions of the epitaxy layer, which are adjacent to the first trenches, and wherein sidewalls of the gate structures are positioned within boundaries of the first doped regions,
    wherein the bottoms of the first trenches, which are covered by the gate structures, are within the first doped regions.

2. The method for fabricating a semiconductor device as claimed in claim 1, wherein the first conductive type is n type, and the second conductive type is p type.

3. The method for fabricating a semiconductor device as claimed in claim 1, wherein a dopant concentration of the semiconductor substrate is larger than that of the epitaxy layer.

4. The method for fabricating a semiconductor device as claimed in claim 1, further comprising:
    performing a first diffusion process, so that the first dopant is uniformly distributed in each of the first doped regions after performing the first doping process; and
    performing a second diffusion process, so that the second dopant is uniformly distributed in each of the second doped regions after performing the second doping process.

5. The method for fabricating a semiconductor device as claimed in claim 4, wherein the epitaxy layer in the first doped regions has the first conductive type, and the epitaxy layer in the second doped regions has the first conductive type.

6. The method for fabricating a semiconductor device as claimed in claim 1, wherein bottom surfaces of the second trenches are within the epitaxy layer.

7. The method for fabricating a semiconductor device as claimed in claim 1, wherein the first and second insulating materials comprise oxide materials or non-doped poly silicon materials, and top surfaces of the first and second insulating materials are aligned to a top surface of the epitaxy layer.

8. The method for fabricating a semiconductor device as claimed in claim 1, wherein the first and second trenches are alternatively disposed in the epitaxy layer.

9. The method for fabricating a semiconductor device as claimed in claim 1, wherein each of the first doped regions is adjacent to one of the second doped regions.

10. The method for fabricating a semiconductor device as claimed in claim 1, wherein the first and second doped regions are pillar shape.

11. The method for fabricating a semiconductor device as claimed in claim 1, wherein a dopant concentration of the first and second doped regions is larger than that of the epitaxy layer.

12. The method for fabricating a semiconductor device as claimed in claim 1, further comprising:
    forming a first well having the second conductive type in the epitaxy layer without covering by the gate structures;
    forming a plurality of source regions having the first conductive type in the first well, wherein the source regions are adjacent to the gate structures, respectively;
    forming an interlayer dielectric layer covering the epitaxy layer and the gate structures;
    removing a portion of the interlayer dielectric layer to form a contact hole, wherein the second trenches and portions of the epitaxy layer, which are adjacent to the second trenches, are exposed from the contact hole;
    forming a plurality of pick-up doped regions having the second conductive type in the portions of the epitaxy layer exposed from the contact hole; and
    filling a conductive material into the contact holes to form a contact plug.

13. The method for fabricating a semiconductor device as claimed in claim 1, wherein forming the gate structures comprises:
    forming a gate oxide layer and a gate layer in sequence; and
    removing a portion of the gate oxide layer and the gate layer, wherein the second trenches are exposed from the gate structures.

14. The method for fabricating a semiconductor device as claimed in claim 1, wherein the plurality of first doped regions are formed beyond the bottoms of the first trenches toward a bottom surface, facing the semiconductor substrate, of the epitaxy layer, so that bottom surfaces of the plurality of first doped regions are positioned between the bottoms of the first trenches and the bottom surface of the epitaxy layer.

* * * * *